(12) United States Patent
Raab et al.

(10) Patent No.: US 12,018,360 B2
(45) Date of Patent: Jun. 25, 2024

(54) Al—Cr—O-BASED COATINGS WITH HIGHER THERMAL STABILITY AND PRODUCING METHOD THEREOF

(71) Applicant: Oerlikon Surface Solutions AG, Pfäffikon, Pfäffikon (CH)

(72) Inventors: Robert Raab, Vienna (AT); Christian Martin Koller, Trofaiach (AT); Paul Heinz Mayrhofer, Neckenmarkt (AT); Mirjam Arndt, Bad Ragaz (CH); Juergen Ramm, Maienfeld (CH)

(73) Assignee: Oerlikon Surface Solutions AG, Pfäffikon, Pfäffikon (CH)

( * ) Notice: Subject to any disclaimer, the term of this patent is extended or adjusted under 35 U.S.C. 154(b) by 198 days.

(21) Appl. No.: 17/862,136

(22) Filed: Jul. 11, 2022

(65) Prior Publication Data
US 2023/0212733 A1 Jul. 6, 2023

Related U.S. Application Data

(62) Division of application No. 16/647,843, filed as application No. PCT/EP2018/075062 on Sep. 17, 2018, now abandoned.

(30) Foreign Application Priority Data

Sep. 15, 2017 (CH) .................................. 01143/17

(51) Int. Cl.
C23C 14/08 (2006.01)
C23C 14/32 (2006.01)
(Continued)

(52) U.S. Cl.
CPC .......... *C23C 14/081* (2013.01); *C23C 14/083* (2013.01); *C23C 14/325* (2013.01);
(Continued)

(58) Field of Classification Search
None
See application file for complete search history.

(56) References Cited

U.S. PATENT DOCUMENTS 5,310,607 A 5/1994 Schulz et al.
2010/0297341 A1 11/2010 Choi et al.
(Continued)

FOREIGN PATENT DOCUMENTS

| CN | 1069294 A | 2/1993 |
| WO | 2010040494 A1 | 4/2010 |
| WO | 2016037590 A1 | 3/2016 |

*Primary Examiner* — Binh X Tran
*Assistant Examiner* — Bradford M Gates

(57) ABSTRACT

A method for producing an Al—Cr—O-based coating on a workpiece surface, including: a) placing a workpiece in an interior of a vacuum chamber, and b) depositing a film comprising aluminum and chromium on the workpiece surface to be coated, wherein a ratio of aluminum to chromium in the film in atomic percentage has a first value corresponding to Al/Cr≤2.3, and c) forming volatile compounds of Cr—O, thereby causing at least part of the chromium contained in the film to leave the film in a form of Cr—O volatile compounds, and d) executing step c) during a period of time, within which the chromium content in the film is reduced until attaining a second value of the ratio of aluminum to chromium in the film in atomic percentage corresponding to Al/Cr≥3.5, thereby the film is transformed into a film containing a reduced content of chromium.

11 Claims, 3 Drawing Sheets

Figure 1:
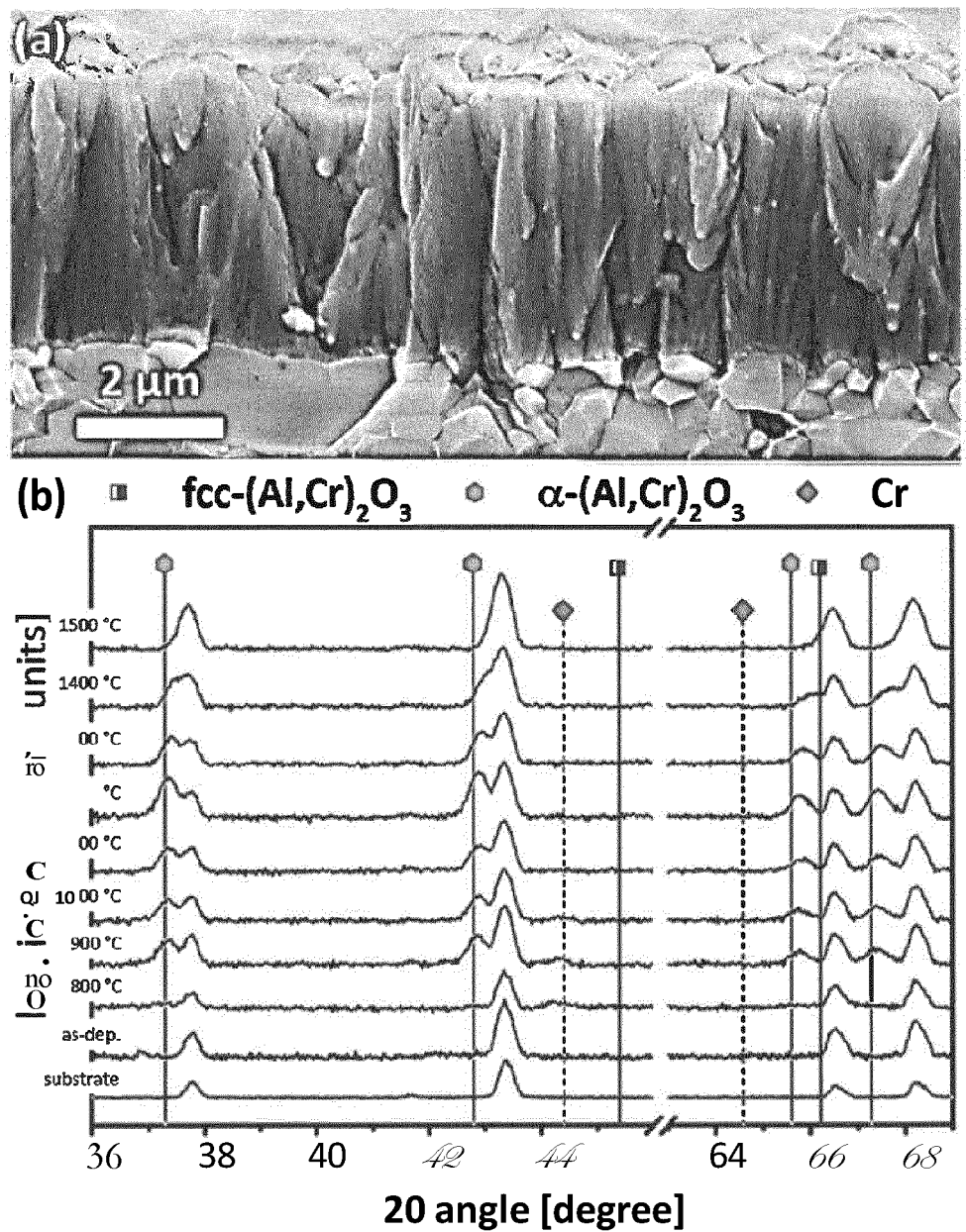

(51) Int. Cl.
  *C23C 14/58*     (2006.01)
  *C23C 28/04*     (2006.01)
(52) U.S. Cl.
  CPC .......... *C23C 14/58* (2013.01); *C23C 14/5806* (2013.01); *C23C 14/5826* (2013.01); *C23C 28/044* (2013.01)

(56) References Cited

U.S. PATENT DOCUMENTS

| | | |
|---|---|---|
| 2012/0308733 A1 | 12/2012 | Von Niessen et al. |
| 2015/0111795 A1* | 4/2015 | Rachbauer ............ C23C 14/083 |
| | | 508/108 |
| 2016/0273093 A1 | 9/2016 | Ramm et al. |
| 2017/0260620 A1 | 9/2017 | Cheah et al. |
| 2018/0340445 A1* | 11/2018 | Opalka ................ F01D 25/005 |
| 2019/0047253 A1 | 2/2019 | Vassen et al. |

* cited by examiner

Al—Cr—O-BASED COATINGS WITH HIGHER THERMAL STABILITY AND PRODUCING METHOD THEREOF

The present invention relates Al—Cr—O-based coatings with higher thermal stability and a method for producing such inventive coatings.

STATE OF THE ART

Aluminum chromium oxide comprising coatings as well as aluminum chromium nitride comprising coatings (also called Al—Cr—O-based and Al—Cr—N-based coatings, respectively) are commonly synthesized by cathodic arc evaporation (hereafter also abbreviated as CAE). These are widely-used materials for coating different kind of tools, e.g. cutting, forming, and milling tools.

These materials are known in particular for exhibiting outstanding thermo-mechanical properties and high wear and oxidation resistance.

However, the current need of a further increase in performance and lifetime of tools and components call for improvements even for already well-established and widely used coating materials.

In machining operations such as dry high-speed cutting, protective coatings ought to withstand temperatures up to 1000° C. or even higher temperatures.

Consequently, coatings designed to effectively perform under economically convenient conditions have to fulfil several criteria which demonstrate complex interdependencies.

Mechanical properties and thermal stability of many Al-comprising transition metal nitrides, such as $(Al_xCr_{1-x})N$, depend on the Al-content comprised in the nitrides.

The synthesis of mechanically favorable coatings exhibiting single face-centered cubic phase (hereafter also abbreviated as fcc) is typically limited by a maximum solubility corresponding to an aluminum fraction in atomic percentage (hereafter also called mole fraction) of $x \approx 0.7$. The ground of this limitation is that beyond of this fraction value a dual phase mixture consisting of fcc phase and hexagonal wurtzite phase (hereafter also abbreviated as w) is observed in coatings produced by CAE.

It has been observed that for attaining best mechanical properties the presence of fcc phase is required, preferably as singular phase.

However it has been also observed that thermal stability can be enhanced by increasing Al-content in the coatings.

For this reason, it is considered of utmost interest to synthesize $(Al_xCr_{1-x})N$ coatings exhibiting fcc single phase and an Al mole fraction corresponding to a value that is as possible close to the threshold value of $x=0.7$.

During both monolithically grown (i.e. as monolayer) and multi-layered grown of $(Al_xCr_{1-x})N$ coatings by PVD processes, it has been observed that singular fcc phase of $(Al_xCr_{1-x})N$ decomposes into wurtzite phase of aluminum nitride (hereafter also abbreviated as w-AlN) and body centered cubic phase of chromium (hereafter also abbreviated as bcc-Cr), which is formed via release of nitrogen of an intermediately formed hexagonal phase of chromium nitride (hereafter also abbreviated as $h-Cr_2N$).

Such phase transitions, especially when related to large volume changes and mass losses, significantly degrade the coating performance. Therefore it would be desirable to find a possibility of suppressing initiation of such phase transitions at application temperatures or even at higher temperatures.

The chemical combination of Al and Cr with oxygen instead of nitrogen gives rise for entirely different material properties, such as even higher thermal stability and resistivity in oxidizing environments.

$Al_2O_3$ coatings used for improving performance of machining tools are usually produced by chemical vapor deposition (hereafter also abbreviated as CVD) processes conducted at temperatures between 800 and 1000° C. This kind of coatings grow typically exhibiting alfa or kappa structure (hereafter also abbreviated as α- and κ-structure, respectively) and are known to provide excellent wear protection and high hot hardness.

A reduction of the growth temperature constitutes a big challenge, in particular because of the polymorphic character of $Al_2O_3$.

The use of coatings formed of corundum type $(Al,Cr)_2O_3$ solid solutions instead of $\alpha\text{-}Al_2O_3$ coatings has been proved to be a promising alternative for coating machining tools in the last years. The main reasons are probably that:

Cr forms an isostructural α-type $Cr_2O_3$ with similar lattice parameters like $\alpha\text{-}Al_2O_3$ and a certain miscibility with $\alpha\text{-}Al_2O_3$, α-type $Cr_2O_3$ can be easily formed by using PVD processes, and it is possible to promote growing of metastable corundum type $(Al,Cr)_2O_3$ solid solutions films at process temperatures between 500° C. and 600° C. by using PVD processes and in particular by using CAE A clear drawback of using the above mentioned metastable corundum type $(Al,Cr)_2O_3$ solid solutions films is however that during machining operations, in which the coated tools are subjected to high temperatures, undesired phases are generally formed, in particular when the Al mole fraction in the corundum type $(Al,Cr)_2O_3$ solid solutions film is higher than 50% (i.e. x>0.5) and the film has been produced by PVD at a low temperature (e.g. between 500° C. and 600° C.).

OBJECTIVE OF THE PRESENT INVENTION

The main objective of the present invention is to provide a method for forming Al—Cr—O-based coatings exhibiting corundum structure, and higher Al content in relation to Cr content and higher thermal stability in comparison with similar Al—Cr—O-based coatings that are produced by conventional PVD processes having aluminum and chromium in a proportion corresponding to a ratio of Al/Cr≤2.3.

DESCRIPTION OF THE PRESENT INVENTION

The objective of the present invention is attained by providing a method for producing an Al—Cr—O-based coatings comprising at least one Al—Cr—O-based or Al—Cr—O-based film on a workpiece surface, wherein the method comprises following steps:

a) placing at least one workpiece having a surface to be coated in the interior of a vacuum chamber, and b) depositing a film A comprising aluminum and chromium on the workpiece surface to be coated, wherein the ratio of aluminum to chromium in the film in atomic percentage has a first value corresponding to Al/Cr≤2.3 and wherein the method further comprises following steps:

c) forming volatile compounds of Cr—O, e.g. $CrZO_3$ and/or $CrO_2$, thereby causing that at least part of the chromium contained in the film A left the film in form of Cr—O volatile compounds, d) executing the step c) during a period of time, within which the chromium content in the film A is reduced until attaining a second value of ratio of aluminum to chromium in the film in atomic percentage, thereby the film A being transformed in a film B containing a reduced content of chromium, which corresponds to an aluminum and chromium in a proportion corresponding to a ratio of Al/Cr≥3.5 or corresponding to a Cr content in atomic percentage of 0% or of approximately 0%.

The film B produced according to the present invention, in the above described manner, contains aluminum and chromium in a proportion corresponding to the second value, which corresponds to a ratio of Al/Cr≥3.5, as it was mentioned above or does not comprise chromium but only aluminum, and exhibits at the same time higher thermal stability than the film A produced previously containing aluminum and chromium in a proportion corresponding to a ratio of Al/Cr≤2.3 that corresponds to the first value.

According to a preferred embodiment of the present invention, an oxygen plasma is generated within the vacuum chamber and the film A deposited in step b) is exposed to the oxygen plasma until Cr diffuses out of the film and react with oxygen available at the surface of the film, thereby forming the volatile compounds of Cr—O in step c).

Preferably the term volatilization refers to the formation of volatile compounds and subsequent phase transition from the solid state to the gas state.

According to a further preferred embodiment of the present invention, the film A deposited in step b) is subjected to annealing in an oxygen-comprising atmosphere at a temperature of above 900° C. until Cr diffuses out of the film and react with oxygen available at the surface of the film, thereby forming the volatile compounds of Cr—O in step c).

Preferably, the conditions for forming the volatile compounds of Cr—O in step c) are adjusted in such a manner that essentially only the volatile compound $CrO_2$ is formed.

In order to form essentially only the volatile compound $CrO_2$, by subjecting the film A to annealing in an oxygen-comprising atmosphere, the annealing temperature must be selected to be higher than 1000° C., preferably higher than 1100° C., more preferably higher than 1200° C.

According to one more preferred embodiment of the present invention, the annealing step is conducted by cyclical application of the temperature.

According to one more preferred embodiment of the present invention, the film A deposited in step b) is an Al—Cr—O film.

According to a preferred embodiment of the present invention the period of time during which the step c) is executed, is selected being so long that at least 90% of the Cr contained in the film A deposited in step b) diffuses out of the film, and in this manner the film B produced in step d) is produced comprising at least 90% alpha-alumina with corundum structure.

"So long that at least 90% of the Cr contained in the film A deposited in step b) diffuses out of the film" refers to the duration of the execution of step c) that is required for reducing the content of Cr in 90%, but preferably at the same time for obtaining phase transformation resulting in a coating layer comprising 90% or more of alpha-alumina with corundum structure.

Figure 2:
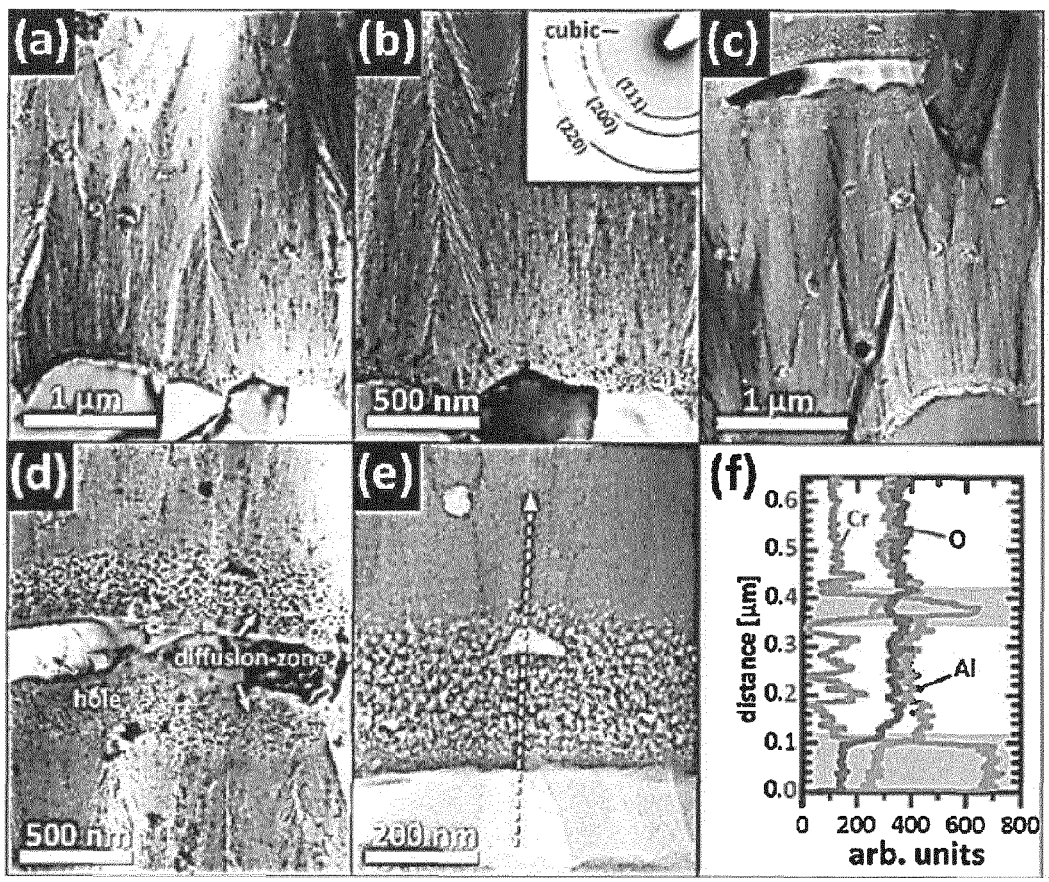
Figure 3:
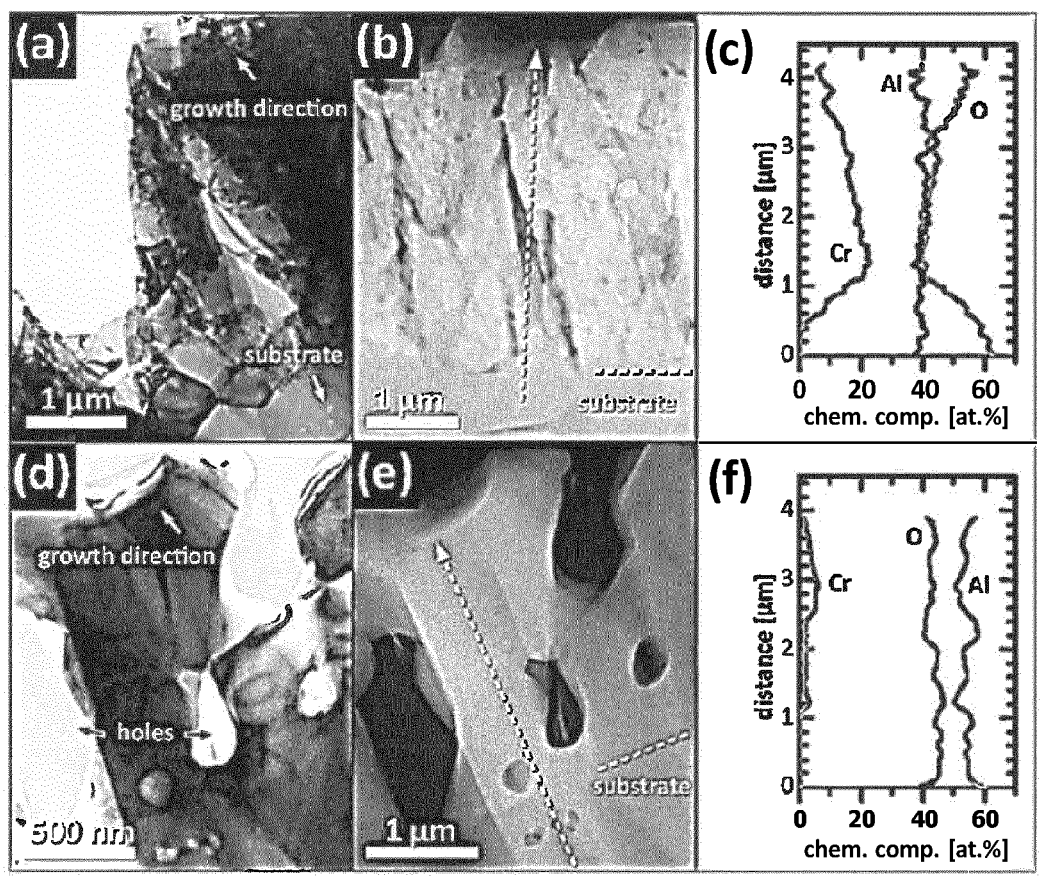

For determining this duration, it would be necessary to conduct different attempts, whereby for each attempt the step c) is executed by adjusting a different duration. In this manner it is possible to examine the coatings before and after execution of the step c) for each attempt and identify which is the duration needed for attaining the claimed features in the coating layer. The claimed features, i.e. 1) reduction of Cr content in 90% or more, and 2) presence of 90% or more of alpha-alumina with corundum structure, can be detected by using energy dispersive X-ray analysis (EDX analysis) for detecting variation of Cr content (for example by conducting an EDX line scan), and by using X-ray diffractometry analysis (XRD measurements and analysis) for detecting presence of alpha-alumina and corundum structure as claimed. Please see that FIG. 1 shows results of X-ray diffractometry (XRD) analysis and FIGS. 2 and 3 show results of EDS line scan analysis.

In a preferred variant of the method according to the embodiment of the present as directly mentioned above, the period of time during which the step c) is executed, is selected being so long that basically all of the Cr contained in the film A deposited in step b) diffuses out of the film, and in this manner the film B produced in step d) is produced consisting practically only of alpha alumina with corundum structure. This method can in particular be used for coating at least a surface of a workpiece (e.g. a tool or a component), wherein the alpha-alumina film with corundum structure that has been formed, comprises pores which have resulted from the diffusion of Cr out of the first film that was formed in a previous step. Such porous alpha-alumina film with corundum structure has the advantage that the heat conduction is reduced, and the porous structures has a better response to thermal mismatch at high temperatures.

According to a preferred embodiment of the present invention the period of time during which the step c) is executed, is selected being so long that so much Cr contained in the film A deposited in step b) diffuses out of the film that the film B comprising essentially only Al—Cr—O solid solution with corundum structure is produced in step d), and the film B produced in this manner has a second value of ratio of aluminum to chromium in atomic percentage corresponding to Al/Cr≥4.

The feature "is selected being so long that so much Cr contained in the film A deposited in step b) diffuses out of the film that the film B is produced comprising . . . " essentially refers the same proceeding for the determination of the duration of step c) as above-mentioned, but also identifying in the EDX analysis, when the Al—Cr—O layer have a ratio of aluminum to chromium in atomic percentage is within the claimed range, i.e. Al/Cr=4.

Preferably the workpiece comprises an alpha-alumina film with corundum structure, which exhibits pores that have been formed during diffusion of Cr out of the film.

Preferably the surface material of the workpiece that is coated is polycrystalline alumina, sapphire corundum, mullite or any other compounds containing alumina, in particular compounds comprising or consisting of a mixture of:
- alumina and yttrium stabilized zirconium oxide, and/or
- alumina and silicon nitride, and/or
- alumina and silicon carbide, and/or
- alumina and yttrium oxide, and/or
- alumina and erbium oxide.

Preferably the workpiece is a turbine engine component.

PARTICULAR ADVANTAGES PROVIDED BY THE PRESENT INVENTION

The present invention is particularly advantageously in comparison with the state of the art at least because it allows:
- producing high thermal stable Al—Cr—O-based films containing corundum type $(Al,Cr)_2O_3$ solid solutions and a high aluminum concentration corresponding to a ratio of Al/Cr≥3.5.

producing structured coatings with pores which result in reduced thermal conductivity

SOME EXAMPLES IN ORDER TO EXPLAIN THE PRESENT INVENTION IN MORE DETAIL

Different coatings were synthetized according to the present invention and investigated.

Some analysis of coatings deposited according to the present invention will be following described in order to facilitate the understanding of the invention.

Figure captions:

FIG. 1: (a) Cross-sectional SEM (as-deposited) image and (b) XRD measurements of as-deposited as well as annealed at Ta=800-1500° C. (in 100° C. steps) in vacuum for 1 h, monolithically grown (Al,Cr)$_2$O$_3$.

FIG. 2: (a) Cross-sectional TEM overview, (b) SAED substrate near region, (c) STEM overview, (d) TEM-BF image of droplet, (e) STEM image and (f) EDX-linescan of droplet of annealed (Al,Cr)$_2$O$_3$ at Ta=900° C. in vacuum for 1 h.

FIG. 3: (a) Cross-sectional TEM BF image, (b) and (c) STEM and corresponding EDS line-scan of (Al,Cr)$_2$O$_3$ after annealing at Ta=1300° C. for 1 h. (d) Cross-sectional TEM BF image, (e) STEM overview with corresponding EDS line-scan (f) of annealed (Al,Cr)$_2$O$_3$ at Ta=1500° C. in vacuum for 1 h.

EXAMPLE AND ANALYSIS OF COATINGS PRODUCED ACCORDING TO THE PRESENT INVENTION

For coating deposition a coating machine of the type Innova of Oerlikon Balzers was used. The coating machine was equipped with a cathodic arc evaporation system.

Powder metallurgically (PM) manufactured targets were used as cathode material.

Targets made of aluminum and chromium were manufactured by Plansee Composite Materials GmbH, having element composition in atomic percentage corresponding to 70% aluminum and 30% chromium.

Low-alloyed steel foil, polycrystalline Al$_2$O$_3$, and Si (100) substrates were ultrasonically cleaned in acetone and ethanol for 10 minutes and then mounted on a two-fold rotation carousel with a minimum target-to-substrate distance of approximately 25 cm.

The deposition chamber was heated by a combined radiation and plasma heating process for approximately 30 minutes in order to attain a process temperature of 500° C.

Argon ion etching was performed for another 30 minutes, in order to remove any contaminations and oxides from the substrate surfaces to be coated.

Monolithically grown (Al$_x$Cr$_{1-x}$)$_2$O$_3$ was deposited by cathodic arc evaporation of four Al$_{0.7}$Cr$_{0.3}$ cathodes, which were operated at an arc current of 180 A in an oxygen atmosphere attained by introducing an oxygen flow of 1000 sccm (average process pressure was of approximately 2.6 Pa).

A negative substrate bias of −40 V was applied to the substrate holder.

The thermal stability of the coatings was investigated by a combination of differential scanning calorimetry (DSC) and thermal gravimetric analysis (TGA) using a DSC-STA 449 F1 Jupiter®, calibrated with 7 elements (In, Sn, Bi, Zn, Al, Ag, Au). The measurements were carried out with a heating rate of 20 K/min up to 1500° C. in a dynamic He atmosphere (protective=50 ml/min; purge=50 ml/min).

The coated polycrystalline Al2O3 substrates were annealed in a Centorr LF22-200 vacuum oven at annealing temperatures Ta ranging from 800 to 1500° C. in steps of 100° C. applying a heating rate of 20 K/min. The samples were hold at peak temperatures for 1 hour and cooling was performed passively.

Chemical and morphological investigations of the coatings were carried out using a FEI Quanta 200 field emission gun scanning electron microscope (FEG SEM) with an EDAX energy dispersive X-ray spectroscopy (EDS) detector attached.

Information on the crystallographic composition was obtained by X-ray diffraction (XRD) in a Bragg-Brentano arrangement (BB: 2θ=15-90°) for annealed powder samples as well as in grazing-incidence arrangement (GI: angle of incidence Ω=2°, 2θ=15-90°. Annealed coatings on Al$_2$O$_3$-substrates were analyzed in an Empyrean PANalytical θ-θ diffractometer with a Cu Kα radiation source and a scintillation-detector.

More detailed examinations on the coating microstructure, were realized by transmission electron microscopy (TEM) including, scanning TEM (STEM), selected-area electron diffraction (SAED), and EDS), using a TECNAI F20 FEG TEM operated with an acceleration voltage of 200 keV and equipped with an EDAX Apollo XLT2 EDS detector.

Energy-dispersive X-ray spectroscopy, carried out on monolithically grown (Al,Cr)$_2$O$_3$ on Si substrates and Al$_2$O$_3$ substrates reveal a chemical composition of (Al$_{0.74}$Cr$_{0.26}$)$_2$O$_3$ and (Al$_{0.76}$Cr$_{0.26}$)$_2$O$_3$ in the as-deposited state with an overall oxygen content of approximately 59 at. %, indicative for a stoichiometric M$_2$O$_3$ state.

FIG. 1 shows the XRD patterns of as-deposited and vacuum annealed monolithically grown (Al$_{0.76}$Cr$_{0.24}$)$_2$O$_3$ on polycrystalline Al$_2$O$_3$ substrates. For the reader's convenience the measurement of an empty substrate is added at the bottom. The green solid hexagons indicating (Al,Cr)$_2$O$_3$ solid solution, are located at 2θ positions according to a Vegard's-like linear behavior for 70 at. % Al$_2$O$_3$ and 30 at. % Cr$_2$O$_3$. Contrary to powder X-ray diffraction measurements we cannot detect any significant fcc XRD peaks of the coating due to the strong substrate peaks. However, according to additional TEM investigations a dual-phase composition of a hexagonal solid solution (Al,Cr)$_2$O$_3$ and a dominant metastable cubic fraction is confirmed. The first XRD peak upon annealing is detectable at Ta=800° C. at 2θ~44.5° and can be assigned to metallic Cr or a solid solution of Cr with a few percent Al. Peak shape and intensity suggest a finer microstructure. At Ta=900° C., peaks located near the (Al$_{0.7}$Cr$_{0.3}$)$_2$O$_3$ position reference emerge. The broad and weak XRD peaks indicative for metallic Cr disappear with Ta=1100° C. while the α-(Al,Cr)$_2$O$_3$ peaks at 37.4, 42.9, 65.8, and 67.5° 2θ increase in intensity upon annealing to 1200° C. Elevating the annealing temperature to 1300° C. and beyond interestingly result in an XRD peak shift to higher diffraction angles, thus towards the pure α-Al$_2$O$_3$ reference. This is an interesting finding as it suggests for an enrichment of the (Al,Cr)$_2$O$_3$ solid solution with Al.

In other words, providing a substrate consisting of sapphire or corundum (or any other temperature stable material) and applying a coating of Al—Cr—O to this substrate, results after tempering at sufficient high temperature in the formation of an epitaxial interface and the formation of alpha alumina coating.

Transmission electron microscopy investigations have been performed to examine thermal-induced crystallographic and microstructural changes of monolithically grown $(Al,Cr)_2O_3$ on polycrystalline $Al_2O_3$ substrates. Bright field TEM imaging of the coating after annealing at 900° C. for 5 minutes, FIGS. 2a and b, reveals a fine-columnar underdense microstructure. SAED investigations along the coating cross-section indicate a cubic structure which could not be identified in the XRD spectrum of FIG. 1. Structural modifications of the coating induced by the vacuum annealing treatment are not significant and the development of a corundum-type phase could not be determined. The Z-contrast STEM acquisition in FIG. 2c reveals the presence of incorporated spherical and flat-shaped macroparticles.

The higher thermal stability of the oxide coating as compared to metallic or intermetallic material is shown by the thermal-induced decomposition of the flat-shaped intermetallic droplet of the TEM BF and STEM images in FIGS. 2d and e, respectively. The dashed white line in FIG. 2e indicates the direction of the EDS line-scan which is provided in FIG. 2f.

The microstructure of the monolithically grown $(Al,Cr)_2O_3$ film annealed in vacuum for 1 h at 1300° C. and 1500° C., shown in FIG. 3a-c and d-f, distinctly coarsened. At these temperatures all metastable phase fractions already transformed into a corundum solid solution. The microstructural modifications are even more pronounced for the sample annealed at Ta=1500° C. For both temperatures, EDS analysis indicate the loss of Cr in the coating. For 1300° C., the Cr content decreases towards the coating surface. For 1500° C., the Cr is nearly total removed from the coating. This loss of Cr in the Al—Cr—O increases the concentration of Al in the solid solution and finally results in the formation of $\alpha$-$Al_2O_3$. It is consistent with the observed peak shifts in the XRD of FIG. 1.

From these results, it can be concluded that above 1000° C. a diffusion of Cr starts resulting in typical profiles like shown in FIG. 3c. The Cr concentration gradually decreasing from the interface between substrate and coating towards the coating surface. The concentration of the Al stays essentially constant. The oxygen content increases towards the coating surface indicating a reaction of Cr with O to CrO2 or CrO3 and following volatilization. At higher temperatures, this process is faster as it can be derived from FIG. 3f. No pronounced interface is visible anymore in the EDS line scan between coating and sapphire substrate, at least not in the Al and O depth profile. Only very little Cr can be detected which is not yet out-diffused from the coating. However, despite the perfect formation of an interface to the sapphire substrate, there are some holes created in the coatings which are due to the loss of Cr.

This surprisingly findings prove that a loss of Cr in the Al—Cr—O coating with increased annealing temperature is the reason for the increase of the Al-content in the coating. In other words, tempering the coatings is a method to produce Al—Cr—O coatings with increased Al content by initiating Cr diffusion towards the substrate surface and subsequent volatilization of Cr, probably via a reaction with oxygen. This diffusion proceeds in vacuum or noble gas atmosphere but can be accelerated by oxygen or even more accelerated by activated oxygen or oxygen plasma.

The term volatilization refers to the formation of volatile compounds and subsequent phase transition from the solid state to the gas state.

In the context of the present invention in particular formation of CrO3 and CrO2—these compounds are considered "volatile" because they have a quick transition from the solid state to the gas state—one manner of forming such volatile compounds (CrO2 and CrO3) according to the present invention is for example by treating the coating comprising Al and Cr with an oxygen plasma, thereby causing that elemental metallic chromium reacts with oxygen and forms the volatile compounds CrO3 or CrO2, thereby causing a phase transition from solid state to gas state.

These surprisingly findings furthermore show that the Cr out-diffusion results in a few very interesting and useful results which can be used in designing a substrate-coating system:
  Creating an Al—Cr—O coating with increased Al-content, preferentially in corundum structure
  Creating $\alpha$-$Al_2O_3$ coatings by synthesizing Al—Cr—O coatings and perform an out-diffusion process described above
  Creating a porous alpha-alumina coating from an Al—Cr—O which can be utilized as thermal barrier coating.

All methods according to the present invention can be advantageous for providing coatings on workpieces whose surface to be coated is made of one of following materials:
  polycrystalline alumina,
  sapphire corundum,
  mullite, or
  any other compound containing alumina, in particular compounds comprising or consisting of a mixture of:
    alumina and yttrium stabilized zirconium oxide, and/or
    alumina and silicon nitride, and/or
    alumina and silicon carbide, and/or
    alumina and yttrium oxide, and/or
    alumina and erbium oxide.

The methods according to the present invention are especially suitable for providing coatings on turbine engine component in order to improve their performance.

The invention claimed is:

1. A method for producing an Al—Cr—O based coating on a workpiece surface, the method comprising:
   a) placing at least one workpiece having a surface to be coated in an interior of a vacuum chamber;
   b) depositing a film A comprising aluminum and chromium on the workpiece surface to be coated, wherein a ratio of aluminum to chromium in the film A in atomic percentage has a first value corresponding to Al/Cr≤2.3; and
   c) forming volatile compounds of Cr—O, thereby causing at least part of the chromium contained in the film A to leave the film A in a form of Cr—O volatile compounds,
   wherein step c) is executed during a period of time, within which the chromium content in the film A is reduced until attaining a second value of the ratio of aluminum to chromium in the film A in atomic percentage corresponding to Al/Cr≥3.5,
   and wherein the film A is transformed into a film B having a reduced content of chromium, corresponding to 0% of chromium or corresponding to said second value of ratio Al/Cr resulting in higher thermal stability than the film A having the ratio of Al/Cr corresponding to said first value.

2. The method according to claim 1, wherein an oxygen plasma is generated within the vacuum chamber and the film A deposited in step b) is exposed to the oxygen plasma until Cr diffuses out of the film A and reacts with oxygen available at a surface of the film A, thereby forming the volatile compounds of Cr—O in step c).

3. The method according to claim 1, wherein the film A deposited in step b) is subjected to annealing in an oxygen-comprising atmosphere at a temperature of above 900° C.

until Cr diffuses out of the film A and reacts with oxygen available at a surface of the film A, thereby forming the volatile compounds of Cr—O in step c).

4. The method according to claim 1, wherein conditions for forming the volatile compounds of Cr—O in step c) are adjusted in such a manner that essentially only the volatile compound $CrO_2$ is formed.

5. The method according to claim 1, wherein the film A deposited in step b) is an Al—Cr—O film.

6. The method according to claim 5, wherein a period of time during which step c) is executed, is selected to be long enough that at least 90% of the Cr contained in the film A deposited in step b) diffuses out of the film A, and the film B being formed comprises at least 90% of alpha-alumina with corundum structure.

7. The method according to claim 6, wherein the period of time during which the step c) is executed, is selected to be long enough that all of the Cr contained in the film A deposited in step b) diffuses out of the film, and the film B is formed comprising only alpha-alumina with corundum structure.

8. The method according to claim 5, wherein a period of time during which step c) is executed, is selected to be long enough that so much Cr contained in the film A deposited in step b) diffuses out of the film that the film B is produced comprising essentially only Al—Cr—O solid solution with corundum structure, thereby having the so produced Al—Cr—O solid solution film B a second value of the ratio of aluminum to chromium in atomic percentage corresponding to Al/Cr≥4.

9. The method according to claim 3, wherein the annealing temperature is selected to be above 1000° C.

10. The method according to claim 3, wherein the annealing temperature is selected to be above 1100° C.

11. The method according to claim 3, wherein the annealing temperature is selected to be above 1200° C.

* * * * *